United States Patent [19]

Numata et al.

[11] 3,995,293

[45] Nov. 30, 1976

[54] PRINTED CIRCUIT FOR PHOTOGRAPHIC CAMERAS

[75] Inventors: Saburo Numata; Shinichiro Fujino, both of Urawa, Japan

[73] Assignee: Fuji Photo Optical Co., Ltd., Omiya, Japan

[22] Filed: Dec. 17, 1975

[21] Appl. No.: 641,766

[30] Foreign Application Priority Data

Dec. 18, 1974 Japan.............................. 49-153665

[52] U.S. Cl............................. 354/202; 354/60 R
[51] Int. Cl.².......................................... G03B 13/02
[58] Field of Search.......... 24/243 K; 354/202, 288, 354/23, 29, 60, 23 D

[56] References Cited

UNITED STATES PATENTS

| 3,670,639 | 6/1972 | Harnden | 354/60 X |
| 3,763,524 | 10/1973 | Wilson | 24/243 K |
| 3,846,805 | 11/1974 | Kiyohara et al. | 354/288 X |

*Primary Examiner*—Donald A. Griffin

[57] ABSTRACT

A space is formed between a wall of a camera body and a part of a printed circuit board fixed to the wall of the camera body. A part of a flexible printed circuit and a resilient member are inserted into the space to resiliently press the flexible circuit onto the printed circuit board to assure a tight electric contact between the flexible printed circuit and the printed circuit board.

2 Claims, 1 Drawing Figure

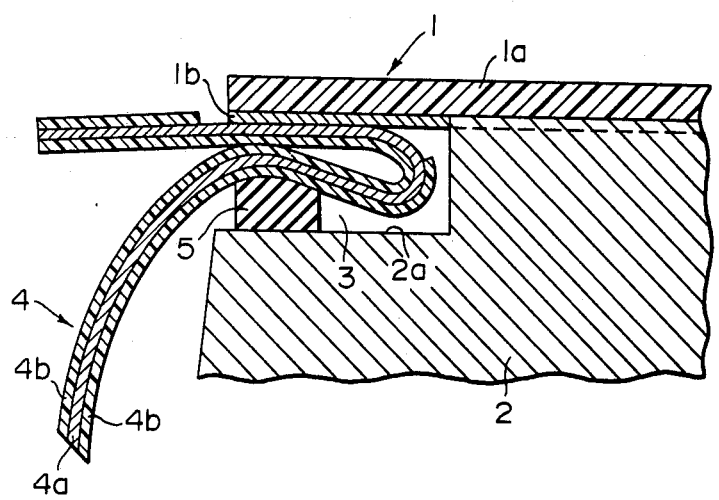

PRINTED CIRCUIT FOR PHOTOGRAPHIC CAMERAS

BACKGROUND OF THE INVENTION

1. Field of the Invention

This invention relates to a printed circuit, and more particularly to a printed circuit for a photographic camera provided with means for connecting the printed circuit to a flexible printed circuit.

2. Description of the Prior Art

In a printed circuit incorporated in a photographic camera, there is generally employed a connector for electrically connecting a printed circuit board made of glass epoxy resin or the like to a flexible printed circuit made of polyimide or the like. The conventional printed circuit which employs a connector has a defect in that the electric contact between the printed circuit and the connector is apt to be incomplete since the copper foil at the contact point is liable to be broken down when the printed circuit board is removed and remounted for inspection purposes. Further, due to the dimensional error of the printed circuit board, electric contact between the printed circuit board and the connector sometimes becomes incomplete.

SUMMARY OF THE INVENTION

In view of the above described defects inherent in the conventional printed circuit, the primary object of the present invention is to provide a printed circuit for a photographic camera in which a printed circuit board and a flexible printed circuit member are put into direct pressure contact with each other.

Another object of the present invention is to provide a printed circuit for a photographic camera which does not employ a connector and accordingly occupies little space in a camera body.

Still another object of the present invention is to provide a printed circuit for a photographic camera which employs a small number of elements and accordingly can be manufactured at a low cost.

The printed circuit in accordance with the present invention is characterized in that a space is formed between a wall of a camera body and a part of a printed circuit board which is fixed to the wall of the camera body, and a part of a flexible printed circuit and a resilient member are inserted into the space with the flexible printed circuit being put into contact with the printed circuit board by the resilient force of the resilient member pinched between the wall of the camera body and the printed circuit board.

Other objects, features and advantages of the present invention will be made more apparent from the following detailed description of the preferred embodiment thereof taken in conjunction with an accompanying drawing in which a single figure shows a fragmentary sectional view of a printed circuit board connected with a flexible printed circuit.

DESCRIPTION OF THE PREFERRED EMBODIMENT

Referring to the drawing, a printed circuit board 1 composed of an insulating substrate 1a and a gold plated copper foil 1b deposited thereon is demountably fixed to a wall of a camera body 2. The wall of the camera body 2 has a recessed portion 2a spaced from said printed circuit board 1 to form a space 3 therebetween. The copper foil 1b of the printed circuit board 1 faces the recessed portion 2a of the camera body.

A flexible printed circuit member 4 composed of a gold plated copper foil 4a and a pair of high insulating cover layers 4b made of polyimide or the like covering both sides thereof is inserted into the space 3 formed between the recessed portion 2a of the wall and the copper foil 1b of the printed circuit board 1. A part of the high insulating cover layer 4b on one side of the flexible printed circuit member 4 is peeled off to expose a part of the copper foil 4a. The exposed gold plated copper foil 4a is put into contact with the surface of the copper foil 1b of the printed circuit board 1. A resilient member 5 made of rubber or plastic material which is elastic at least in the direction to press the flexible printed circuit member 4 onto the copper foil 1b of the printed circuit board 1 is inserted between the recessed portion 2a of the wall and the flexible printed circuit member 4.

When assemblying the printed circuit in a camera body, the flexible printed circuit member 4 and the resilient member 5 are inserted in the space 3 when the printed circuit board 1 is mounted to the wall of the camera body 2 so that the flexible printed circuit member 4 is connected with the printed circuit board 1 simultaneously with the mounting of the board 1 to the wall of the camera body 2.

We claim:

1. A printed circuit for a photographic camera mounted to a wall of a camera body comprising in combination:
    a printed circuit board composed of an insulating substrate and a conductive layer provided thereon, said printed circuit board being mounted to a part of the wall of a camera body of the camera with the conductive layer thereof facing the wall,
    said wall of the camera body having a recessed portion to form a space between the same and said printed circuit board mounted thereto,
    a flexible printed circuit member having a conductive layer a part of which is exposed, said flexible printed circuit member being inserted into said space with the exposed conductive part thereof put into contact with said conductive layer of the printed circuit board, and
    a resilient member inserted into said space between the flexible printed circuit member and the recessed portion of the wall of the camera body to put the exposed conductive layer of the flexible printed circuit member into pressure contact with the conductive layer of the printed circuit board.

2. A printed circuit for a photographic camera as claimed in claim 1 wherein said flexible printed circuit member comprises a conductive layer sandwiched between a pair of insulating cover layers.

* * * * *